(12) United States Patent
Shin et al.

(10) Patent No.: US 9,474,167 B2
(45) Date of Patent: Oct. 18, 2016

(54) MULTILAYERED SUBSTRATE

(71) Applicant: SAMSUNG ELECTRO-MECHANICS CO., LTD., Suwon (KR)

(72) Inventors: Yee Na Shin, Suwon (KR); Seung Eun Lee, Sungnam (KR); Yul Kyo Chung, Yongin (KR); Doo Hwan Lee, Daejeon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 51 days.

(21) Appl. No.: 14/061,160

(22) Filed: Oct. 23, 2013

(65) Prior Publication Data

US 2014/0182889 A1 Jul. 3, 2014

(30) Foreign Application Priority Data

Dec. 31, 2012 (KR) ........................ 10-2012-0158337

(51) Int. Cl.
| | |
|---|---|
| *H05K 1/02* | (2006.01) |
| *H05K 1/11* | (2006.01) |
| *H05K 3/46* | (2006.01) |
| *H01L 23/00* | (2006.01) |
| *H05K 1/18* | (2006.01) |

(52) U.S. Cl.
CPC ............. *H05K 3/4673* (2013.01); *H01L 24/19* (2013.01); *H01L 2224/04105* (2013.01); *H05K 1/185* (2013.01); *H05K 3/4602* (2013.01); *H05K 2201/0154* (2013.01); *H05K 2201/029* (2013.01); *H05K 2201/09136* (2013.01)

(58) Field of Classification Search
USPC ...................................................... 174/251
See application file for complete search history.

(56) References Cited

U.S. PATENT DOCUMENTS

| | | | |
|---|---|---|---|
| 8,305,766 B2* | 11/2012 | Park ........................ | H01L 23/13 361/761 |
| 2009/0078458 A1* | 3/2009 | Araumi ..................... | C08K 3/22 174/262 |
| 2011/0155433 A1* | 6/2011 | Funaya ............. | H01L 23/49827 174/258 |
| 2011/0274877 A1* | 11/2011 | Yu .............................. | B32B 3/10 428/138 |
| 2011/0290538 A1* | 12/2011 | Han ....................... | H05K 3/361 174/254 |
| 2011/0300401 A1* | 12/2011 | Yamanishi ............ | B32B 15/018 428/607 |
| 2012/0006469 A1 | 1/2012 | Inagaki et al. | |

FOREIGN PATENT DOCUMENTS

| | | |
|---|---|---|
| JP | 6-61594 | 3/1994 |
| JP | 2002-283498 | 10/2002 |
| JP | 2009-218545 | 9/2009 |
| KR | 10-2010-0048685 | 5/2010 |
| TW | 201105189 | 2/2011 |

OTHER PUBLICATIONS

Korean Notice of Allowance issued May 20, 2014 in corresponding Korean Patent Application No. 10-2012-0158337.
Taiwanese Office Action dated Mar. 26, 2015 in corresponding Taiwanese Patent Application No. 102137611.

* cited by examiner

*Primary Examiner* — Timothy Thompson
*Assistant Examiner* — Paul McGee, III
(74) *Attorney, Agent, or Firm* — NSIP Law

(57) ABSTRACT

Disclosed herein is a multilayered substrate including: a second insulating layer having a fine pattern layer formed on an upper surface thereof; and a third insulating layer having a circuit pattern layer formed on an upper surface thereof and formed of a material different from the second insulating layer, the circuit pattern layer having a pattern pitch larger than that of the fine pattern layer, thereby making it possible to solve a warpage problem and perform refinement and improvement in a degree of integration of an inner wiring.

15 Claims, 4 Drawing Sheets

120

MULTILAYERED SUBSTRATE

CROSS REFERENCE(S) TO RELATED APPLICATIONS

This application claims the benefit under 35 U.S.C. Section 119 of Korean Patent Application Serial No. 10-2012-0158337, entitled "Multilayered Substrate" filed on Dec. 31, 2012, which is hereby incorporated by reference in its entirety into this application.

BACKGROUND OF THE INVENTION

1. Technical Field

The present invention relates to a multilayered substrate.

2. Description of the Related Art

In order to respond to the trend toward lightness, miniaturization, high-speed, multi-function, and high-performance of an electronic device, technologies in which a plurality of wiring layers are formed on a printed circuit board (PCB), so called, multilayered substrate technologies have developed. Further, a technology embedding an electronic component in a multilayered substrate has also developed.

For example, Patent Document 1 discloses a printed circuit board having an electronic component inserted into a cavity and formed of a plurality of layers and a method of manufacturing the same.

Meanwhile, an example of important subjects in a multilayered substrate field includes allowing an embedded electronic component to efficiently transmit and receive a signal including voltage or current to and from an external circuit or other devices.

In addition, as the trend toward high-performance of the electronic component, and miniaturization and thinning of the electronic component and the electronic component embedded substrate has recently intensified, an improvement in a degree of integration of circuit patterns is necessarily also needed to be accompanied in order to embed a small electronic component in a thinner and narrower substrate and connect an outer electrode of the electronic component to the outside.

Meanwhile, as the electronic component embedded substrate becomes thinner, a bending phenomenon of the substrate comes to the forefront with a severe problem. The above-mentioned bending phenomenon is referred to as warpage and as the electronic component embedded substrate is configured of various materials having different thermal expansion coefficients, the warpage has intensified.

According to the related art, in order to decrease the above-mentioned warpage, a method in which an insulating layer is formed of a material having strong rigidity has been used. However, in the case in which the insulating layer is formed of only the material having strong rigidity, since a surface of the insulating layer is rough, there was a limitation in improving a degree of integration of wiring patterns formed on the insulating layer.

RELATED ART DOCUMENT

Patent Document (Patent Document 1) US Patent Laid-Open Publication No. 2012-0006469

SUMMARY OF THE INVENTION

An object of the present invention is to provide a multilayered substrate having decreased warpage and improving a degree of integration of an inner wiring.

According to an exemplary embodiment of the present invention, there is provided a multilayered substrate, including: a second insulating layer having a fine pattern layer formed on an upper surface thereof; and a third insulating layer having a circuit pattern layer formed on an upper surface thereof and formed of a material different from the second insulating layer, the circuit pattern layer having a pattern pitch larger than that of the fine pattern layer.

The third insulating layer may be disposed closer to an outer surface of the multilayered substrate as compared to the second insulating layer.

The second insulating layer may have surface roughness smaller than that of the third insulating layer.

The third insulating layer may include a core material made of a material including a glass fiber.

The second insulating layer may be made of polyimide.

The second insulating layer may include a filler.

The second insulating layer may be made of an Ajinomoto build-up film (ABF), and the third insulating layer may be made of a pre-preg (PPG).

The filler may have a diameter less than 5 µm and the filler may have flatness less than 0.5.

The multilayered substrate may further include: a first insulating layer including a cavity; and an electronic component at least partially inserted into the cavity and having an external electrode formed on a surface thereof, wherein the second insulating layer may cover the electronic component on the first insulating layer, and the fine pattern layer and the external electrode may be directly connected to each other by a via.

The first insulating layer may further include a conductor pattern layer on a surface thereof, and the fine pattern layer and the conductor pattern layer may be directly connected to each other by the via.

The third insulating layer may be formed as at least one layer at the outermost portion of the multilayered substrate.

The second insulating layer may be formed as at least two layers in the outermost direction of the multilayered substrate.

The first insulating layer may be a metal core including a metal material.

The pattern pitch of the fine pattern layer may be 10 µm or less, and the pattern pitch of the circuit pattern layer may be 15 µm or more.

A line width of the fine pattern layer may be 10 µm or less, and a line width of the circuit pattern layer may be 15 µm or more.

The fine pattern layer may be formed by a semi-additive process (SAP) and the circuit pattern layer may be formed by a modified semi-additive process (MSAP).

DESCRIPTION OF THE PREFERRED EMBODIMENTS

Figure 1:
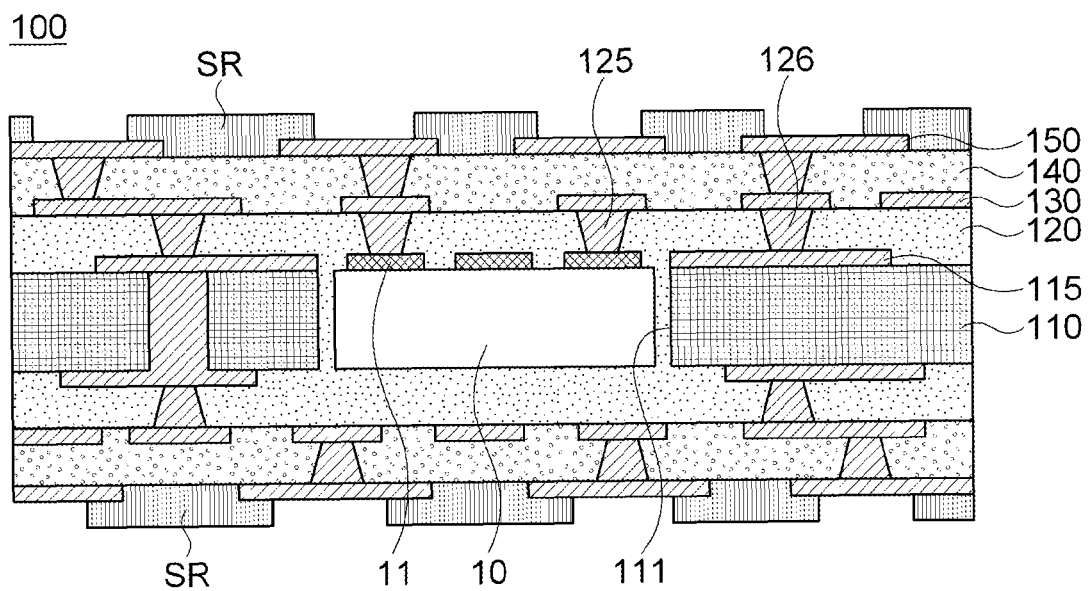
FIG. 1 is a cross-sectional view schematically showing a multilayered substrate according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the description denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure. Additionally, components shown in the accompanying drawings are not necessarily shown to scale. For example, sizes of some components shown in the accompanying drawings may be exaggerated as compared with other components in order to assist in understanding of exemplary embodiments of the present invention. Like reference numerals on different drawings will denote like components, and similar reference numerals on different drawings will denote similar components, but are not necessarily limited thereto.

In the specification and the claims, terms such as "first", "second", "third", "fourth" and the like, if any, will be used to distinguish similar components from each other and be used to describe a specific sequence or a generation sequence, but is not necessarily limited thereto. It may be understood that these terms are compatible with each other under an appropriate environment so that exemplary embodiments of the present invention to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted and/or any other step that is not described herein may be added to the method.

In the specification and the claims, terms such as "left", "right", "front", "rear", "top", "bottom", "over", "under", and the like, if any, do not necessarily indicate relative positions that are not changed, but are used for description. It may be understood that these terms are compatible with each other under an appropriate environment so that exemplary embodiments of the present invention to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an exemplary embodiment" means the same exemplary embodiment, but is not necessarily limited thereto.

Hereinafter, a configuration and an acting effect of exemplary embodiments of the present invention will be described in more detail with reference to the accompanying drawings.

FIG. 1 is a cross-sectional view schematically showing a multilayered substrate 100 according to an exemplary embodiment of the present invention.

Referring to FIG. 1, the multilayered substrate 100 according to an exemplary embodiment of the present invention may include a second insulating layer 120 and a third insulating layer 140.

In this configuration, an upper surface of the second insulating layer 120 may be provided with a fine pattern layer 130 and an upper surface of the third insulating layer 140 may be provided with a circuit pattern layer 150.

Here, the fine pattern layer 130 may have a pattern pitch smaller than that of the circuit pattern layer 150.

In addition, the second insulating layer 120 and the third insulating layer 140 are implemented by materials different from each other.

That is, in the multilayered substrate 100 according to the exemplary embodiment of the present invention, the fine pattern layer 130 having a relatively smaller pattern pitch is formed on the second insulating layer 120 and the circuit pattern layer 150 having a relatively larger pattern pitch is formed on the third insulating layer 140 made of the material different from that of the second insulating layer.

In accordance with the trend toward miniaturization and thinning of an electronic device or an electronic component 10, line widths and pitches of patterns included therein need to be decreased and the problem due to the warpage also needs to be solved at the same time.

Therefore, the insulating layer is implemented by a material including a core material so that the warpage may be decreased. However, since a surface of the material including the core material is significantly rough, it is difficult to implement the fine circuit pattern.

In addition, in the case in which the insulating layer is implemented by a material which does not include the core material in order to implement the fine circuit pattern, the problem due to the warpage is intensified.

That is, in a general multilayered substrate according to the related art, challenges such as refinement of the wiring pattern and decreasing of the warpage may be in a trade-off relationship.

According to the exemplary embodiments of the present invention, the second insulating layer 120 may be implemented by a material capable of forming the fine pattern layer 130 and the circuit pattern layer 150 having a pattern pitch relatively larger than the fine pattern layer 130 may be formed on the third insulating layer 140.

In this case, the third insulating layer 140 may be made of a material capable of decreasing the warpage of the multilayered substrate 100. That is, the thermal expansion rate of the third insulating layer 140 may be smaller than that of the second insulating layer 120 or the rigidity of the third insulating layer 140 may be larger than that of the second insulating layer 120. As an exemplary embodiment, the third insulating layer 140 may include the core material 142 therein, where a glass fiber and the like may be applied as the core material 142. For example, the third insulating layer 140 may be made of a pre-preg (PPG).

In addition, it is advantageous for the decrease of the warpage to position the third insulating layer 140 at an outer side of the multilayered substrate 100 as compared to the second insulating layer 120.

Meanwhile, in the case of including the core material 142 in order to intensify the rigidity of the third insulating layer 140, surface roughness of the third insulating layer 140 may become relatively larger.

Figure 2:
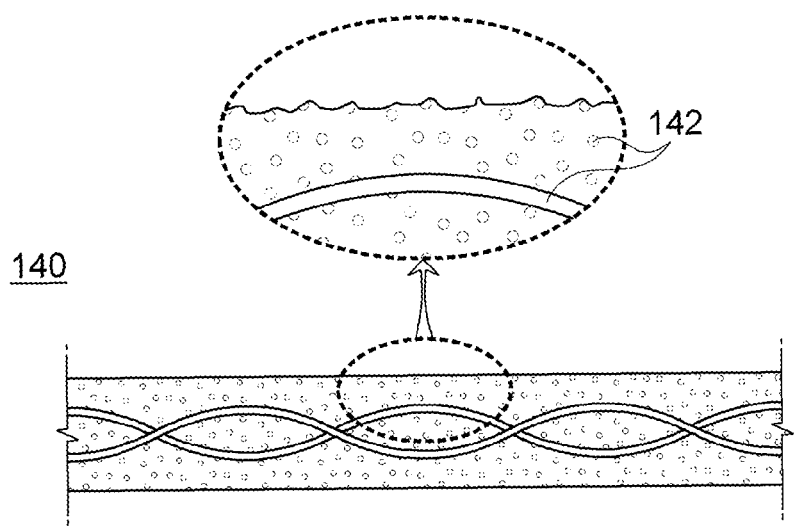
FIG. 2 is a partially enlarged cross-sectional view schematically showing a third insulating layer in the multilayered substrate according to an embodiment of the present invention.
Figure 3:
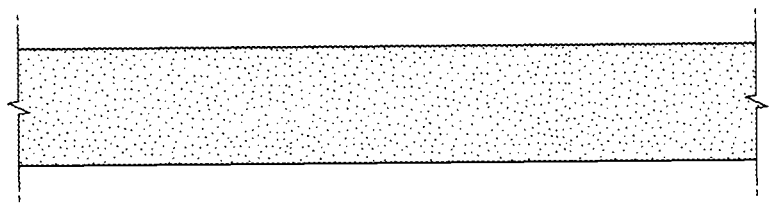
FIG. 3 is a partially enlarged cross-sectional view schematically showing a second insulating layer in the multilayered substrate according to an embodiment of the present invention.

FIG. 2 is a partially enlarged cross-sectional view schematically showing a third insulating layer 140 in the multilayered substrate 100 according to an embodiment of the present invention and FIG. 3 is a partially enlarged cross-sectional view schematically showing a second insulating layer 120 in the multilayered substrate 100 according to an embodiment of the present invention.

Referring to FIGS. 2 and 3, as the third insulating layer 140 includes the core material 142, it may be appreciated that the surface roughness of the third insulating layer 140 becomes larger than that of the second insulating layer 120 which does not include the core material 142.

Figure 4:
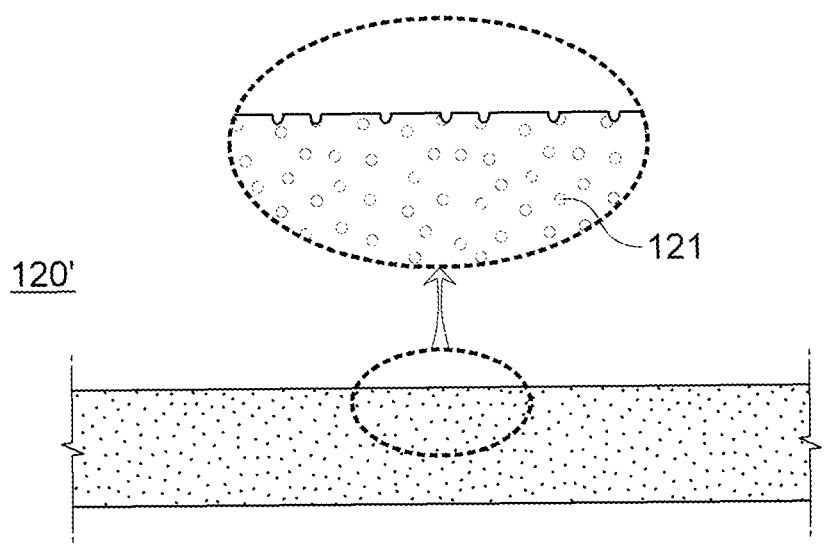
FIG. 4 is a partially enlarged cross-sectional view schematically showing a second insulating layer in a multilayered substrate according to another embodiment of the present invention.
Figure 5:
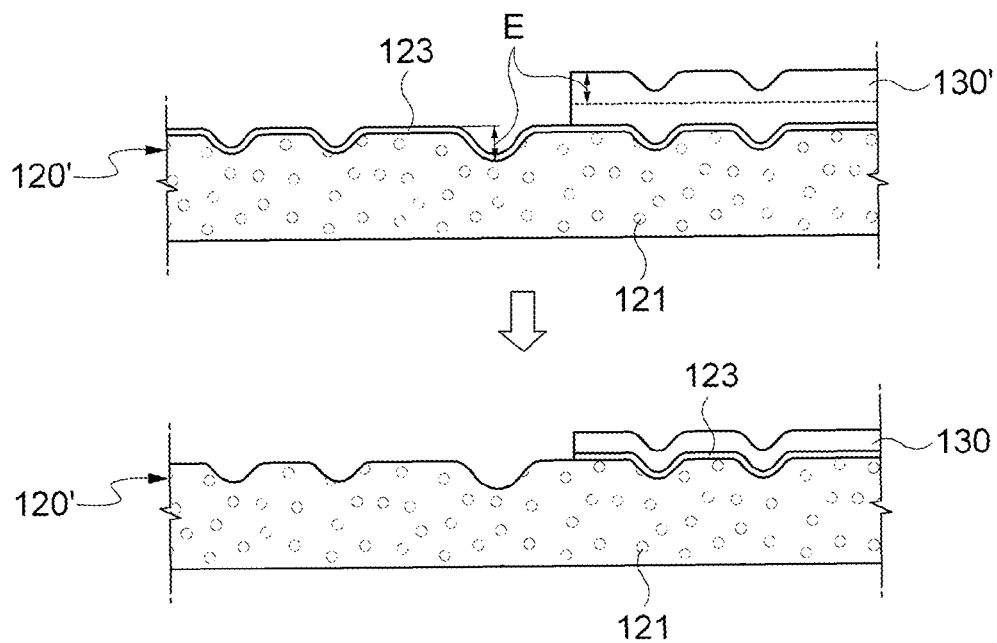
FIG. 5 is a partially enlarged process cross-sectional view for describing a problem generated when forming a pattern layer in the second insulating layer illustrated in FIG. 4.

FIG. 4 is a partially enlarged cross-sectional view schematically showing a second insulating layer 120' in a multilayered substrate according to another embodiment of the present invention and FIG. 5 is a partially enlarged process cross-sectional view for describing a problem generated when forming a pattern layer in the second insulating layer 120' illustrated in FIG. 4.

Referring to FIG. 4, a second insulating layer 120' may include fillers 121. The filler 121 is mainly made of inorganic matter and is included in an insulating material to serve to lower dielectric constant. The filler 121 may serve to decrease thermal expansion coefficient of the second insulating layer 120' or improve rigidity of the second insulating layer 120' to a predetermined level.

As shown in FIGS. 3 and 4, the insulating layer 120 does not include the core material 142 and may include the filler 121 in some cases.

For example, the second insulating layer 120 may be made of an Ajinomoto build-up film (ABF).

Meanwhile, in the case in which the second insulating layer 120' includes the filler 121, the surface roughness of the second insulating layer 120' may be increased.

Referring to FIG. 5, in the case in which the circuit pattern is formed by applying a semi-additive process (SAP), a process of removing a seed layer 123 by an etching method is included, wherein as shown in FIG. 5, if the surface roughness is larger, an etched part E becomes thicker and a conductive pattern 130' is also etched by the thickness of the etched part E during the etching, such that the thickness of the pattern unnecessarily becomes thinner.

Therefore, in order to form the fine pattern layer 130 on the second insulating layer 120 by applying the SAP, a diameter of the filler 121 needs to be limited to a predetermined level or less, and particularly, may be below 5 µm.

In addition, as a shape of the filler 121 closes to an oval shape, flowability in the insulating material is deteriorated, such that the surface of the second insulating layer 120' becomes rougher. Therefore, flatness of the filler 121 may be below 0.5.

Therefore, the surface roughness of the second insulating layer 120 may have a value enough to finely form the circuit pattern by applying the SAP, and thus the fine pattern layer 130 formed on the second insulating layers 120 and 120' may be formed by applying the SAP.

Even in the case in which the fine circuit pattern is formed by applying the SAP on the third insulating layer 140 including the core material 142 to thereby have larger surface roughness, a problem may be generated by a principle similar to that as described with reference to FIG. 5.

The circuit pattern layer 150 formed on the third insulating layer 140 may be formed by a modified semi-additive process (MSAP) in which copper foil is bonded and a pattern is then implemented by plating.

In addition, in accordance with high-performance of the electronic components 10, a pitch between external electrodes 11 included in the electronic component 10 gradually becomes smaller.

Therefore, the fine pattern layer 130 formed on the surface of the second insulating layer 120 contacting the external electrode 11 of the electronic component 10 may be implemented at a high degree of integration corresponding to the external electrode 11 of the electronic component 10.

According to the exemplary embodiments of the present invention, a pattern pitch of the fine pattern layer 130 may be 10 µm or less and a pattern pitch of the circuit pattern layer 150 may be 15 µm or more. Further, a line width of the fine pattern layer 130 may be 10 µm or less and a line width of the circuit pattern layer 150 may be 15 µm or more.

Again referring to FIG. 1, the multilayered substrate 100 according to the exemplary embodiment of the present invention may further include the first insulating layer 110 and the electronic component 10.

In this case, the first insulating layer 110 may be a core substrate and may be a metal core including a metal material.

Therefore, the warpage phenomenon of the multilayered substrate 100 may be further decreased.

In addition, the electric component 10 may be an active element or a passive element including the external electrode 11 (or an external terminal).

Here, the second insulating layer 120 may be a build-up layer formed on the first insulating layer 110.

That is, the electronic component 10 included in a cavity 111 and the first insulating layer 110 may be covered by the second insulating layer 120.

In addition, the fine pattern layer 130 formed on the second insulating layer 120 may be connected to the external electrode 11 of the electronic component 10 through the shortest path by a via 125.

In addition, a surface of the first insulating layer 110 may be further provided with a conductor pattern layer 115, where the conductor pattern layer may also be connected to the fine pattern layer 130 through the shortest path by a via 126.

In the case in which the electronic component 10 is the active element such as an integrated chip (IC), the surface of the electronic component 10 may be provided with a plurality of external electrodes 11. In this case, as performance of the electronic component 10 is improved, the number of the external electrodes 11 included in the electronic component 10 is increased. Moreover, in order to meet the trend toward miniaturization of the electronic device, the electronic component 10 such as the IC is also miniaturized. Therefore, very many external electrodes 11 cannot but be included on the surface of a very small electronic component 10, and the circuit pattern for connecting each of the external electrodes 11 to another electronic component 10 or other devices through various paths also needs to be implemented by many lines in a narrow area.

In the case of the multilayered substrate 100 according to the exemplary embodiment of the present invention, the external electrode 11 of the electronic component 10 is directly connected to the fine pattern layer 130 on the second insulating layer 120 by the via 125. For the reason as described above, as the line width and the pattern pitch of the circuits configured of the fine pattern layer 130 on the second insulating layer 120 become narrower and smaller, respectively, the area of the multilayered substrate 100 may be decreased.

Particularly, when the second insulating layer 120 is formed of the insulating material including the core material 142, there is a limitation in decreasing the pattern pitch of the fine pattern layer 130. Therefore, the inventors of the present invention have formed the second insulating layer 120 by a material which does not include the core material 142.

In addition, the third insulating layer 140 is formed of the material including the core material 142, thereby also making it possible to decrease the warpage.

Therefore, the multilayered substrate 100 according to the exemplary embodiment of the present invention may improve the circuit integration and solve warpage problems at the same time.

Meanwhile, although the foregoing description is based on the case in which the second insulating layer 120 is formed on an upper portion of the first insulating layer 110 and the third insulating layer 140 is formed on an upper portion of the second insulating layer 120, the second insulating layer 120, the third insulating layer 140, and the like may be formed on a lower portion of the first insulating layer 110 in the same scheme as described above, as shown in FIG. 1.

Figure 6:
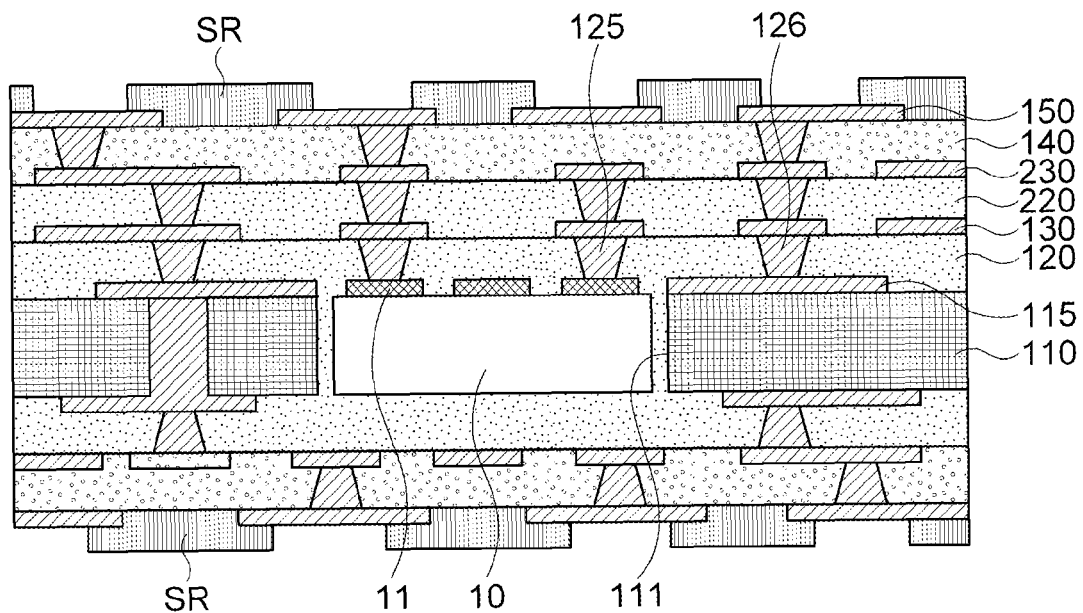
FIG. 6 is a cross-sectional view schematically showing a multilayered substrate according to another exemplary embodiment of the present invention.
Figure 7:
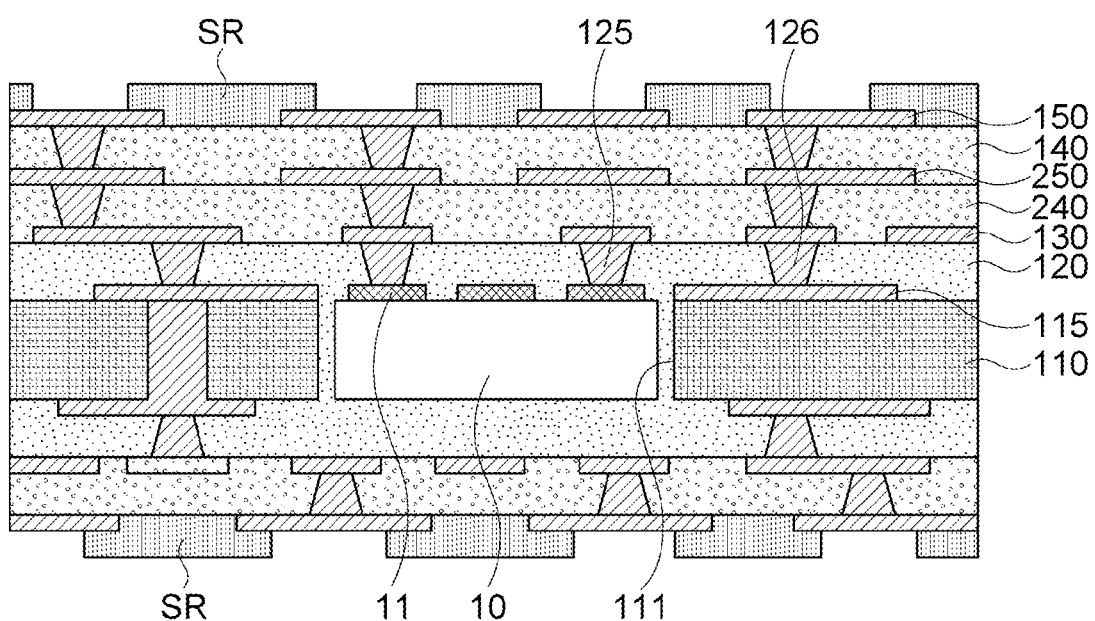
FIG. 7 is a cross-sectional view schematically showing a multilayered substrate according to still another exemplary embodiment of the present invention.

FIG. 6 is a cross-sectional view schematically showing a multilayered substrate according to another exemplary embodiment of the present invention and FIG. 7 is a cross-sectional view schematically showing a multilayered substrate according to still another exemplary embodiment of the present invention.

Referring to FIGS. 6 and 7, three or more wiring layers may be formed on the first insulating layer 110. In this configuration, in the case in which one fine pattern layer 130 is further required, the second insulating layer 120 and the fine pattern layer 130 may be formed to be two or more layers, as shown in FIG. 6.

In this case, two consecutive layers from the first insulating layer 110 may be formed of the second insulating layer 120.

That is, in FIG. 6, a part represented by reference numerals 120 and 130 may form one layer and a part represented by reference numeral 220 and 230 thereon may form the other layer.

On the other hand, unless the fine pattern layer 130 is further required, the third insulating layer 140 and the circuit pattern layer 150 are formed to be two or more layers, as shown in FIG. 7, thereby making it possible to advantageously decrease the warpage.

That is, in FIG. 7, a part represented by reference numerals 140 and 150 may form one layer and a part represented by reference numeral 240 and 250 therebelow may form the other layer.

The present invention configured as described above may solve the warpage problem and may perform refinement and improvement of a degree of integration of an inner wiring

What is claimed is:

1. A multilayered substrate, comprising:
   a second insulating layer having a fine pattern layer formed on an upper surface thereof; and
   a third insulating layer
      having a circuit pattern layer formed on an upper surface thereof and formed of a material different from the second insulating layer, the circuit pattern layer having a pattern pitch larger than that of the fine pattern layer,
      disposed closer to an outer surface of the multilayered substrate as compared to the second insulating layer, and
      having a thermal expansion rate smaller than that of the second insulating layer or a rigidity larger than that of the second insulating layer,
   wherein the second insulating layer has surface roughness smaller than that of the third insulating layer.

2. The multilayered substrate according to claim 1, wherein the third insulating layer includes a core material made of a material including a glass fiber.

3. The multilayered substrate according to claim 2, wherein the second insulating layer is made of polyimide.

4. The multilayered substrate according to claim 2, wherein the second insulating layer includes a filler.

5. The multilayered substrate according to claim 4, wherein the second insulating layer is made of an Ajinomoto build-up film (ABF), and
   the third insulating layer is made of a pre-preg (PPG).

6. The multilayered substrate according to claim 4, wherein the filler has a diameter less than 5 μm.

7. The multilayered substrate according to claim 4, wherein the filler has flatness less than 0.5.

8. The multilayered substrate according to claim 1, further comprising:
   a first insulating layer including a cavity; and
   an electronic component at least partially inserted into the cavity and having an external electrode formed on a surface thereof,
   wherein the second insulating layer covers the electronic component on the first insulating layer, and
   the fine pattern layer and the external electrode are directly connected to each other by a via.

9. The multilayered substrate according to claim 8, wherein the first insulating layer further includes a conductor pattern layer on a surface thereof, and
   the fine pattern layer and the conductor pattern layer are directly connected to each other by the via.

10. The multilayered substrate according to claim 8, wherein the third insulating layer is formed as at least one layer at the outermost portion of the multilayered substrate.

11. The multilayered substrate according to claim 8, wherein the second insulating layer is formed as at least two layers in the outermost direction of the multilayered substrate.

12. The multilayered substrate according to claim 8, wherein the first insulating layer is a metal core including a metal material.

13. The multilayered substrate according to claim 1, wherein the pattern pitch of the fine pattern layer is 10 μm or less, and the pattern pitch of the circuit pattern layer is 15 μm or more.

14. The multilayered substrate according to claim 13, wherein a line width of the fine pattern layer is 10 μm or less, and a line width of the circuit pattern layer is 15 μm or more.

15. The multilayered substrate according to claim 1, wherein the fine pattern layer is formed by a semi-additive process (SAP) and the circuit pattern layer is formed by a modified semi-additive process (MSAP).

* * * * *